United States Patent
Lee et al.

(10) Patent No.: US 7,217,625 B2
(45) Date of Patent: May 15, 2007

(54) METHOD OF FABRICATING A SEMICONDUCTOR DEVICE HAVING A SHALLOW SOURCE/DRAIN REGION

(75) Inventors: Sang-Jin Lee, Seoul (KR); Kyung-Soo Kim, Uijeongbu (KR); Chang-Bong Oh, Seongnam (KR); Hee-Sung Kang, Seongnam (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 27 days.

(21) Appl. No.: 10/753,447

(22) Filed: Jan. 9, 2004

(65) Prior Publication Data

US 2004/0203210 A1    Oct. 14, 2004

(30) Foreign Application Priority Data

Apr. 8, 2003    (KR) .................. 10-2003-0021921

(51) Int. Cl.
   *H01L 21/336* (2006.01)
(52) U.S. Cl. .................. 438/303; 438/595; 438/696; 438/703
(58) Field of Classification Search ........ 438/197, 438/299–232, 301, 303–306, 689, 289, 585, 438/595, 696, 694, 703
See application file for complete search history.

(56) References Cited

U.S. PATENT DOCUMENTS 6,586,306 B2 * 7/2003 Lee et al. ............... 438/305

6,737,308 B2 * 5/2004 Kim ........................ 438/197
2002/0192868 A1 * 12/2002 Kim ........................ 438/112
2003/0232464 A1 * 12/2003 Roy et al. ................ 438/128

FOREIGN PATENT DOCUMENTS

| JP | 2001-094100 | 4/2001 |
| JP | 2001-274263 | 10/2001 |
| JP | 2002-016246 | 1/2002 |
| KR | 1020020003761 | 1/2002 |
| KR | 1020020017092 | 3/2002 |

* cited by examiner

*Primary Examiner*—Zandra V. Smith
*Assistant Examiner*—Thanh Y. Tran
(74) *Attorney, Agent, or Firm*—Volentine & Whitt, PLLC

(57) ABSTRACT

A method of fabricating a semiconductor device forms a shallow source/drain region after a deep source/drain region. First, a gate insulating layer including a gate pattern and a gate electrode are formed on a semiconductor substrate. A buffer insulating layer, a first insulating layer, and a second insulating layer are then sequentially formed on the entire surface of the gate pattern and the semiconductor substrate. A first spacer is formed on the first insulating layer at both sidewalls of the gate pattern by etching the second insulating layer. A deep source/drain region is then formed on the semiconductor substrate as aligned by the first spacer. The first spacer is removed. Next, an offset spacer is formed at both sidewalls of the gate pattern by etching the first insulating layer. Finally, a shallow source/drain region is formed on the semiconductor substrate adjacent to the deep source/drain region as aligned by the offset spacer.

20 Claims, 3 Drawing Sheets

METHOD OF FABRICATING A SEMICONDUCTOR DEVICE HAVING A SHALLOW SOURCE/DRAIN REGION

BACKGROUND OF THE INVENTION

1. Field of the Invention

The present invention relates to a method of fabricating a semiconductor device. More particularly, the present invention relates to a method of fabricating a semiconductor device having shallow and deep source/drain regions.

2. Description of the Related Art

The source/drain regions of recently developed high-density semiconductor devices have a lightly doped drain (LDD) structure to suppress short channel effects. The source/drain regions, that comprise an LDD structure, include a low-density, shallow source/drain region on a semiconductor substrate adjacent to a gate pattern and a deep source/drain region on the semiconductor substrate adjacent to the shallow source/drain region. The shallow source/drain region is referred to as a source/drain extension because it extends from the deep source/drain region.

However, as the line width of the gate patterns of semiconductor devices becomes 90 nm or less, shallow source/drain regions having shallower junctions and lower resistances are needed. High-energy ion-implantation and annealing (a thermal process) for activating the ion-implanted impurities are used to form the deep source/drain region. The annealing process diffuses the ion-implanted impurities. Therefore, it is difficult to form a shallow source/drain region having a shallow junction and a low resistance.

A reverse-ordered source/drain region formation method has been introduced in an attempt to solve such an impediment to the forming of both a deep source/drain region and a shallow source/drain region having a shallow junction and low resistance. According to the reverse-ordered source/drain region formation method, the shallow source/drain region (source/drain extension) is formed after the deep source/drain region is formed. More specifically, a disposable spacer is formed at both sidewalls of a gate pattern. The structure is then subjected to ion-implantation and a thermal treatment to form the deep source/drain region. Then the disposable spacer is removed. The resultant structure is then ion-implanted and thermally treated, thus forming the shallow source/drain region. However, according to the reverse-ordered source/drain region formation method, the ion-implanted impurities overlap each other in the shallow source/drain region due to the small line width of the gate pattern.

An offset spacer formation method has been suggested as a way to solve such a problem. According to the offset spacer formation method, a first spacer is formed before the shallow source/drain region is formed. Then the ion-implantation process and thermal process are performed to prevent the ion-implanted impurities from overlapping. After the shallow source/drain region is formed, a second spacer is formed. The resultant structure is subjected to ion-implantation, and a thermal treatment.

However, the offset spacer formation method causes direct etch damage to the active region when the first and second spacers are formed. If the second spacer is formed without removing the first spacer, it is difficult to form the second spacer to an appropriate thickness between adjacent gates by using conventional deposition and etching techniques, due to the high density of the device. Removing the second spacer causes etch damage to the active region. Even worse, according to the offset spacer formation method, at least four films are deposited to form the two spacers, which results in a large thermal budget for the semiconductor device.

SUMMARY OF THE INVENTION

An object of the present invention is to provide a method of fabricating a semiconductor device, which solves the problems associated with the conventional reverse-ordered source/drain region formation and offset spacer formation methods.

According to an aspect of the present invention, a method of fabricating a semiconductor device begins by forming a gate pattern, comprising a gate insulating layer and a gate electrode, on a semiconductor substrate. A buffer insulating layer, a first insulating layer, and a second insulating layer are then sequentially formed on the entire surface of the gate pattern and the semiconductor substrate. A first spacer is formed on the first insulating layer at both sidewalls of the gate pattern by etching the second insulating layer. A deep source/drain region is formed on the semiconductor substrate as aligned by the first spacer. The first spacer is then removed. An offset spacer is formed at both sidewalls of the gate pattern by etching the first insulating layer. Then, a shallow source/drain region is formed on the semiconductor substrate adjacent to the deep source/drain region as aligned by the offset spacer.

Preferably, the second insulating layer is formed of material having a high etch selectivity with respect to the first insulating layer. For example, the second insulating layer is formed of an oxide layer, and the first insulating layer is formed of a nitride layer. The first insulating layer is preferably thus formed of material having a high etch selectivity with respect to the buffer insulating layer. For example, the first insulating layer is formed of a nitride layer, and the buffer insulating layer is formed of an oxide layer.

The forming of the deep source/drain region may be carried out by ion-implanting impurities using the first spacer as an ion-implantation mask, and annealing the ion-implanted impurities. The annealing of the ion-implanted impurities is thus performed before the shallow source/drain region is formed. Alternatively, the deep source/drain region may be formed using plasma doping.

The forming of the shallow source/drain region may also comprise ion-implanting impurities into the entire surface of the semiconductor substrate using the second spacer as an ion-implantation mask, and annealing the ion-implanted impurities. The annealing of the ion-implanted impurities in this case is performed at a temperature of 500–800° C. or 900–1300° C. using rapid thermal annealing or spike thermal processing, respectively. Alternatively, the shallow source/drain region may be formed using solid phase epitaxy or plasma doping.

According to the present invention, the deep source/drain region is formed before the shallow source/drain region and yet, it is possible to minimize the potential for the overlapping of ion-implanted impurities in the shallow source/drain region even when the line width of gate pattern is very small. Moreover, only three layers on the gate pattern are used to form the first and second spacers.

BRIEF DESCRIPTION OF THE DRAWINGS

The above and other features and advantages of the present invention will become more apparent from the following detailed description of the preferred embodiments thereof made with reference to the attached drawings in which.

DETAILED DESCRIPTION OF THE PREFERRED EMBODIMENTS

Figure 1:
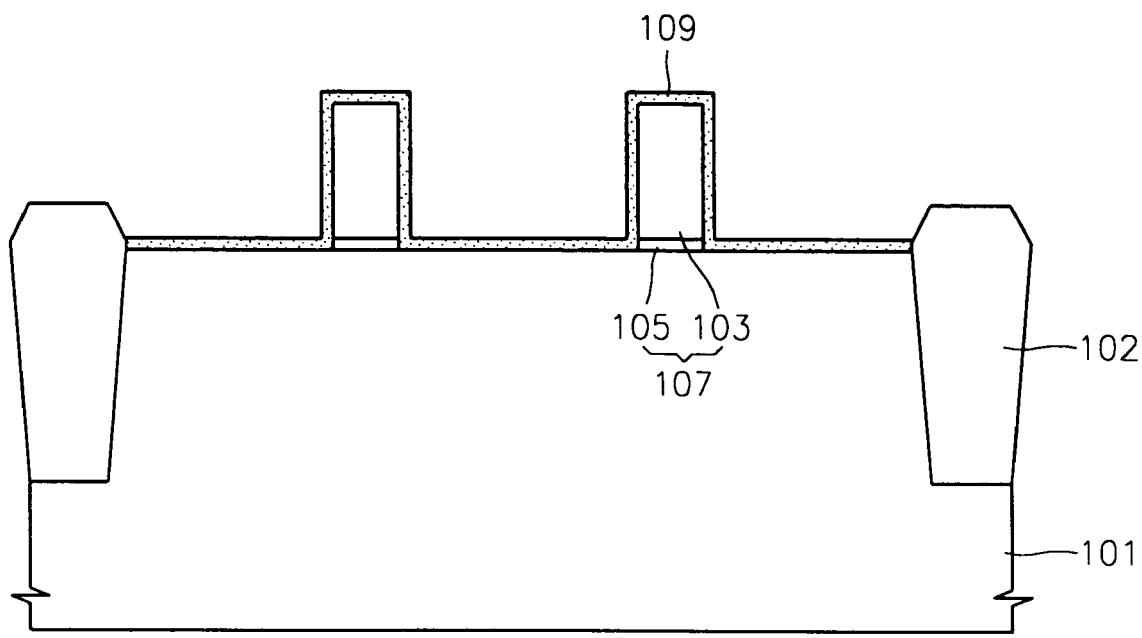
FIGS. 1 through 6 are cross-sectional views of a semiconductor substrate, showing a method of fabricating a shallow/source drain region of a semiconductor device according to the present invention.

Referring to FIG. 1, an active region is defined by forming a trench region 102 on a semiconductor substrate 101, e.g., a silicon substrate or silicon on insulator (SOI) substrate, using shallow trench isolation (STI) technology. Subsequently, and although not shown in FIG. 1, various ion-implantation processes such as a well ion-implantation process for formation of well, a channel ion-implantation process for controlling a threshold voltage, and a field ion-implantation process for improving isolation characteristics are performed.

Next, a gate insulating layer 105 is formed on the active region of the semiconductor substrate 101. The gate insulating layer 105 is formed of $SiO_2$, $Si_3N_4$, SiON, $ZrO_2$, $HfO_2$, $Ta_2O_5$, or $Al_2O_3$. A gate electrode 103 is formed on the gate insulating layer 103. The gate electrode 103 is formed of a polysilicon layer, an SiGe layer, a metal silicide layer, a metal layer, or a combination thereof. That is, an insulating layer and a conductive layer are sequentially formed on the semiconductor substrate 101 and are patterned using a photolithography process Thus, a gate pattern 107 is formed of the gate insulating layer 105 and the gate electrode 103. In the present invention, the line width of the gate pattern 107 is less than 0.1 μm, i.e. the present invention is applicable to the fabricating of a high-density semiconductor device.

Next, a buffer insulating layer 109 is formed on the entire surface of the gate pattern 107 and the semiconductor substrate 101. In this embodiment, the buffer insulating layer 109 is an oxide layer formed by oxidizing the semiconductor substrate 101 on which the gate pattern 107 is formed. In other words, the buffer insulating layer 109 is formed using an oxidization process to cure etch damage caused by the process of forming the gate pattern 107. The buffer insulating layer 109 has a thickness of 20–30 Å. The buffer insulating layer 109 is used as an etch stopper for a subsequent process in which a first insulating layer is etched to form a first spacer.

Figure 2:
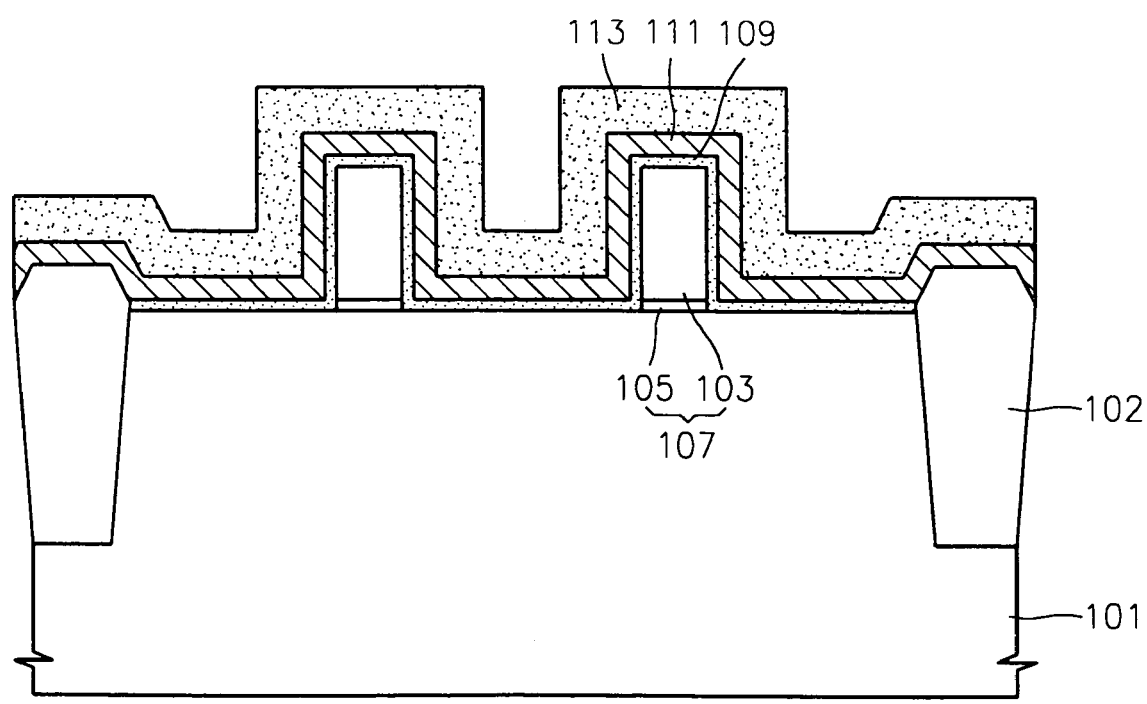

FIG. 2 depicts the sequential forming of a first insulating layer 111 and a second insulating layer 113 on the buffer insulating layer 109. The first insulating layer 111 and the second insulating layer 113 are used as ion-implantation masks for the forming of a deep source/drain region. The second insulating layer 113 has a high etching selectivity with respect to the first insulating layer 111. The first insulating layer 111 has a high etching selectivity with respect to the buffer insulating layer 109. In this embodiment, the second insulating layer 113 is an oxide layer, and the first insulating layer 111 is a nitride layer. The thickness of the first insulating layer 111 is determined based on the thickness of an offset spacer used in an ion-implantation process for the forming of a shallow source/drain region. The thickness of second insulating layer 113 is determined based on the thickness of first spacer.

Figure 3:
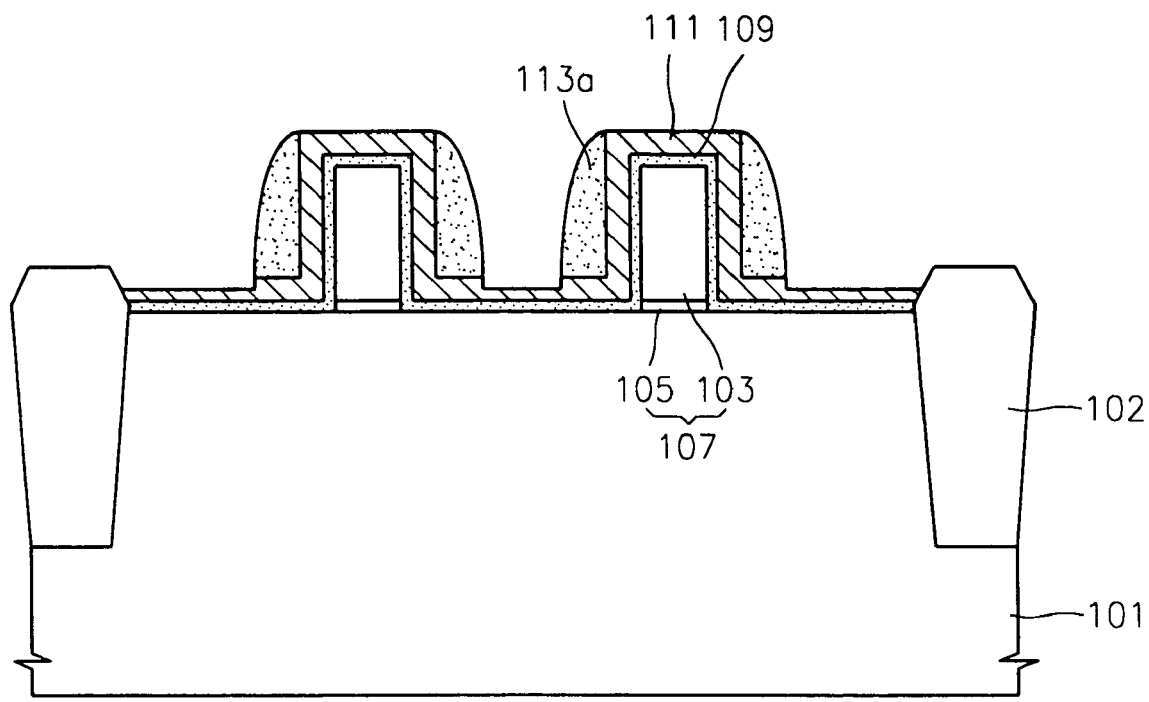

FIG. 3 depicts the forming of a first spacer 113a. More specifically, the second insulating layer 113 is etched using the first insulating layer 111 as an etch stopper. Thus, the first spacer 113a is formed on the first insulating layer 111 at both sidewalls of the gate pattern 107. The second insulating layer 113 can be etched using either a dry etch back or a wet etch back process. The first spacer 113a is used as an ion-implantation mask for the forming of a deep source/drain region. For example, if a dry etch back process is used, the first insulating layer 111 acts as an etch stopper because the first insulating layer 111 has a high etch selectivity with respect to the second insulating layer 113. Thus, the dry etch back continues until the top surface of first insulating layer 111 is exposed. At this time, the first insulating layer 111 may be over-etched. However, the surface of the semiconductor substrate 101, e.g., the buffer insulating layer 109 on the active region should not be exposed to prevent etch damage to the active region.

Figure 4:
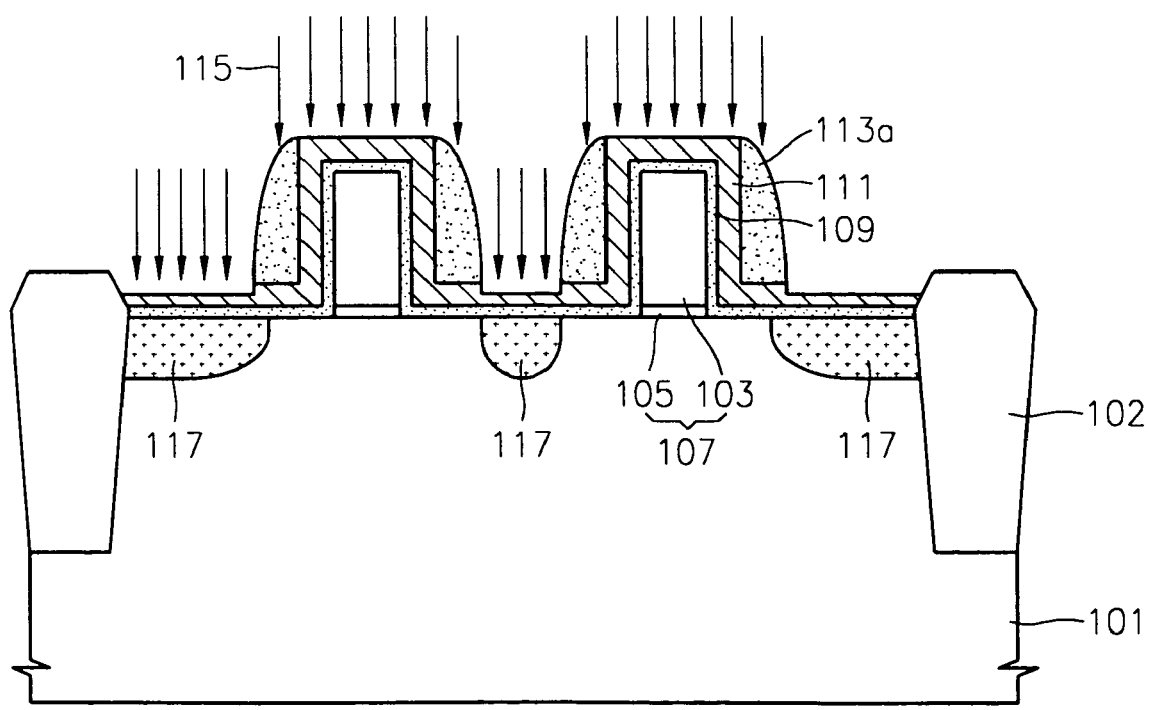

FIG. 4 depicts the forming of a deep source/drain region 117. More specifically, high-energy impurities 115 are ion-implanted over the entire surface of the semiconductor substrate 101. The impurities 115 are of a p-type or n-type. An annealing process is performed to activate the impurities 115. The annealing process is performed using rapid thermal annealing. Accordingly, the deep source/drain region 117 is formed on the semiconductor substrate 101 as aligned with the first spacer 113a, i.e., to the sides of first spacer 113a. The thickness of the first spacer 113a dictates the distance between a sidewall of gate pattern 107 and the deep source/drain region 117.

In particular, according to the present invention, the deep source/drain region 117 is formed before the shallow source/drain region, i.e., before the source/drain extension is formed. Thus, an annealing process sufficient for forming the deep source/drain region 117 can be performed, followed by a minimal annealing process in connection with the forming of the shallow source/drain region to suppress short channel effects. Thus, the impurities 115 are prevented from diffusing throughout the shallow source/drain region.

In this embodiment, the annealing process for forming the deep source/drain region 117 is performed just after the ion-implantation process. However, the annealing process may be performed at any time before the forming of the shallow source/drain region. Also, although the deep source/drain region 117 has been described as being formed using ion-implantation, the deep source/drain region 117 may instead be formed using a plasma doping process.

Figure 5:
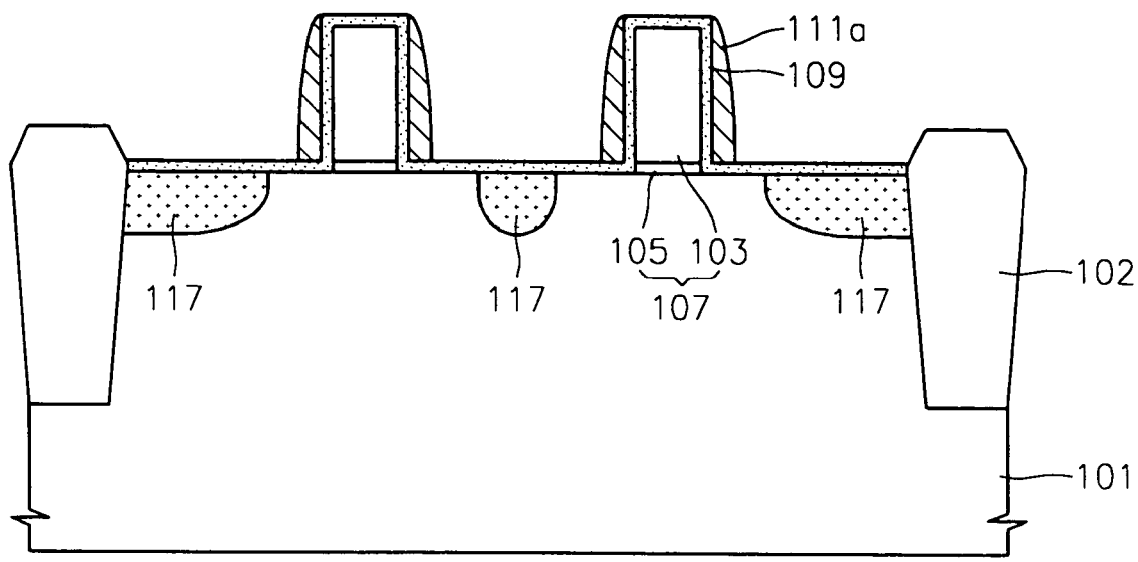

FIG. 5 depicts the forming of an offset spacer 111a. More specifically, the first spacer 113a is removed using wet etching. Then the first insulating layer 111 is etched to form the offset spacer 111a at both sidewalls of the gate pattern 109. The first insulating layer 111 is etched using either a dry etch back or a wet etch back process. In any case, the first insulating layer 111 is etched until the top surface of the buffer insulating layer 109 is exposed. The offset spacer 111a is formed to prevent ion-implanted impurities from overlapping in the shallow source/drain region due to the relatively small line width of the gate pattern 109.

Figure 6:
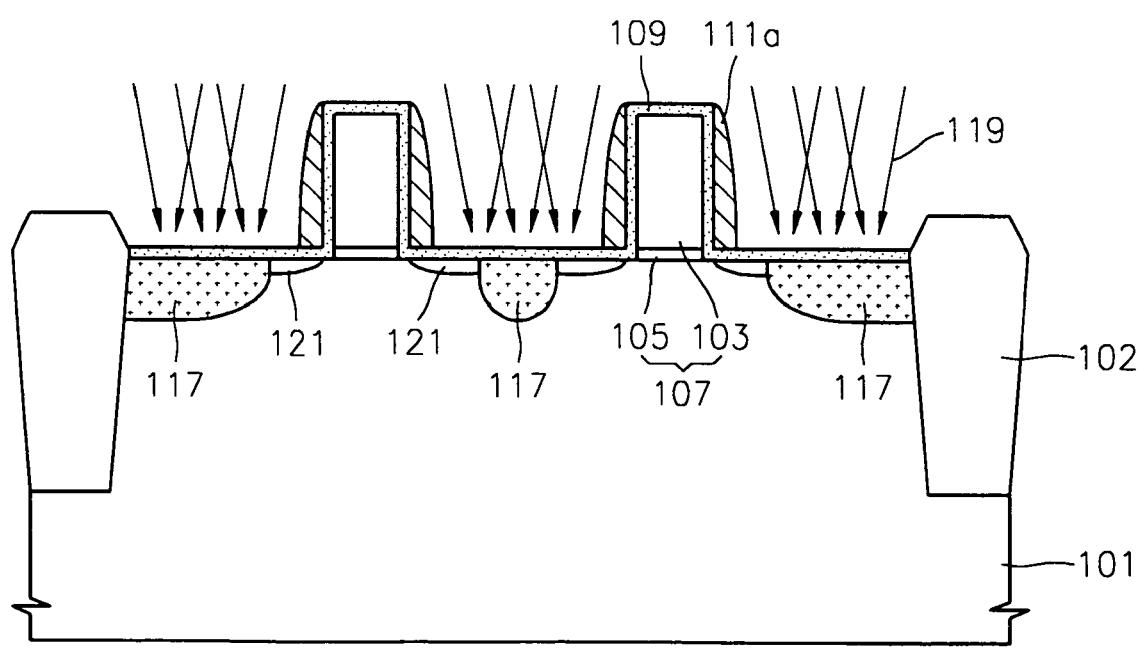

FIG. 6 depicts the forming of the shallow source/drain region 121 as aligned with the offset spacer 111a. More specifically, impurities 119 are implanted over the entire surface of the semiconductor substrate 101 to form the shallow source/drain region 121 and a halo ion implantation region. The impurities 119 used to form the shallow source/drain region 121 are implanted before the impurities 119 used to form the halo ion implantation region. For example, if the semiconductor substrate 101 is of a p-type, the impurities 119 used to form the shallow source/drain region 121 are of an n-type, e.g., As or P, and are implanted at a low energy of less than several KeV. The impurities 119 used to form the halo ion implantation region are of a p-type, e.g., B, and are implanted at a high energy.

Next, the annealing process is performed for activating the ion-implanted impurities 119. The annealing process is performed at a temperature of 500–800° C. or at a temperature 900–1300° C. using rapid thermal annealing or spike thermal processing. Spike thermal processing can raise the temperature of the substrate at a higher rate than rapid thermal annealing, e.g., at a rate of 200° C. per second. In this case, the substrate is thermally treated for several seconds. As a result, the shallow source/drain region 121 is formed on the semiconductor substrate 101 at both sidewalls of the gate pattern 107 as aligned with the offset spacer 111a. Also, the halo ion implantation region (not shown) is optionally formed under the deep source/drain region 117 and the shallow source/drain region 121. The halo ion-implantation region is not shown in FIG. 6 for convenience and is used to reinforce the channel by suppressing the short channel effect.

As described above, the shallow source/drain region 121, i.e., the source/drain extension, is formed after the deep source/drain region 117. Thus, it is possible to suppress a short channel effect caused by the diffusion of impurities throughout the shallow source/drain region 121. In addition, it is possible to minimize the potential for the overlapping of ion-implanted impurities in the shallow source/drain region of the semiconductor device even when the the gate pattern has a fine line width.

In the method described above in connection with FIG. 6, the offset spacer 111a was not etched before the impurities 119 were ion-implanted. However, the length of the shallow source/drain region 121 can be controlled by wet etching the offset spacer 111a before the impurities 119 are ion-implanted. In addition, that part of the method shown in connection with FIG. 6 included an annealing process performed after ion-implantation. However, this annealing process may be omitted. Also, note, the shallow source/drain region 121 may be formed using solid phase epitaxy or plasma doping instead of ion-implantation.

As described above, a sufficient annealing process can be performed to form the deep source/drain region using the reverse-ordered source/drain formation method. A minimal annealing process can then be performed to form the shallow source/drain region and yet, the short channel effect is suppressed. Hence, the shallow source/drain region can have a shallow junction. Also, it is possible to minimize the overlapping of ion-implanted impurities in the shallow source/drain region of the semiconductor device even when the gate pattern has a small line width.

Moreover, according to the present invention, a minimal number of films are used for forming the first spacer and the offset spacer. Accordingly, the thermal budget of the semiconductor device can be minimized and there is only one time during the process that etch damage can occur at the active region.

Finally, although the present invention has been particularly shown and described with reference to the preferred embodiments thereof, various changes in form and details thereto will become readily apparent to those of ordinary skill in the art. Accordingly, the true spirit and scope of the present invention is not limited to the preferred embodiments described above but is defined by the following claims.

What is claimed is:

1. A method of fabricating a semiconductor device, the method comprising:

forming a gate pattern comprising a gate insulating layer and a gate electrode, on a semiconductor substrate;

sequentially forming a buffer insulating layer, a first insulating layer, and a second insulating layer over the entire surface of the gate pattern and the entire surface of the semiconductor substrate;

etching the second insulating layer to form a first spacer on the first insulating layer at both sidewalls of the gate pattern, wherein the buffer insulating layer and a least a thickness portion of the first insulating layer remain over the entire surface of the gate pattern and the semiconductor substrate after etching of the second insulating layer to form the first spacer;

subsequently forming a deep source/drain region on the semiconductor substrate as aligned by the first spacer by implanting ions in the substrate through first insulating layer and the buffer insulating layer;

removing the first spacer;

etching the first insulating layer to remove some of the first insulating layer and leave a portion of the first insulating layer over the buffer insulating layer at both sidewalls of the gate pattern, thereby forming an offset spacer comprising said portion of the first insulating layer over the buffer insulating layer at both sidewalls of the gate pattern, wherein the buffer insulating layer located over the deep source/drain region is exposed during the etching of the first insulating layer; and subsequently forming a shallow source/drain region on the semiconductor substrate adjacent to the deep source/drain region as aligned by the offset spacer.

2. The method of claim 1, wherein the second insulating layer is formed of material having a high etch selectivity with respect to the first insulating layer.

3. The method of claim 2, wherein the second insulating layer is formed of an oxide layer, and the first insulating layer is formed of a nitride layer.

4. The method of claim 1, wherein the first insulating layer is formed of material having a high etch selectivity with respect to the buffer insulating layer.

5. The method of claim 4, wherein the first insulating layer is formed of a nitride layer, and the buffer insulating layer is formed of an oxide layer.

6. The method of claim 1, wherein said forming of the deep source/drain region comprises ion-implanting impurities using the first spacer as an ion-implantation mask.

7. The method of claim 6, wherein said forming of the deep source/drain region further comprises annealing the ion-implanted impurities before the shallow source/drain region is formed.

8. The method of claim 1, wherein said forming of the deep source/drain region comprises ion-implantation or plasma doping.

9. The method of claim 1, wherein said forming of the shallow source/drain region comprises ion-implantation, solid phase epitaxy, or plasma doping.

10. A method of fabricating a semiconductor device, the method comprising:

forming a gate pattern comprising a gate insulating layer and a gate electrode, on a semiconductor substrate;

sequentially forming a buffer insulating layer, a first insulating layer, and a second insulating layer over the entire surface of the gate pattern and the semiconductor substrate;

etching the second insulating layer to form a first spacer on the first insulating layer at both sidewalls of the gate pattern, wherein the buffer insulating layer and a least a thickness portion of the first insulating layer remain over the entire surface of the gate pattern and the semiconductor substrate after etching of the second insulating layer to form the spacer;

subsequently forming a deep source/drain region on the semiconductor substrate as aligned by the first spacer by implanting ions in the substrate through first insulating layer and the buffer insulating layer;

removing the first spacer;

etching the first insulating layer to remove some of the first insulating layer and leave a portion of the first insulating layer over the buffer insulating layer at both sidewalls of the gate pattern, thereby forming and offset spacer comprising said portion of the first insulating layer over the buffer insulating layer located over the deep source/drain region is exposed during the etching of the first insulating layer; and subsequently ion-implanting impurities over the entire surface of the semiconductor substrate using the offset spacer as an ion-implantation mask and annealing the ion-implanted impurities to form a shallow source/drain region on the semiconductor substrate adjacent to the deep source/drain region as aligned by the offset spacer.

11. The method of claim 10, wherein said annealing of the ion-implanted impurities is performed at temperature of 500–800° C. or 900–1300° C. using rapid thermal annealing or spike thermal processing.

12. A method of fabricating a semiconductor device, the method comprising:

forming a gate pattern comprising a gate insulating layer and a gate electrode, on a semiconductor substrate;

forming a buffer insulating layer on the entire surface of the gate pattern and the entire surface of the semiconductor substrate;

sequentially forming a first insulating layer and a second insulating layer on the buffer insulating layer;

etching the second insulating layer to form a first spacer on the first insulating layer at both sidewalls of the gate pattern, wherein the buffer insulating layer and a least a thickness portion of the first insulating layer remain over the surface of the gate pattern and the semiconductor substrate after etching of the second insulating layer to form the first spacer;

ion-implanting impurities into the semiconductor substrate through the first insulating layer and the buffer insulating layer, using the first spacer as an ion-implantation mask, and annealing the ion-implanted impurities to form a deep source/drain region;

removing the first spacer;

etching the first insulating layer to remove some of the first insulating layer and leave a portion of the first insulating layer over the buff insulating layer at both sidewalls of the gate pattern, thereby forming an offset spacer comprising said portion of the first insulating layer over the buffer insulating layer at both sidewalls of the gate pattern, wherein the buffer insulating layer located over the deep source/drain region is exposed during the etching of the first insulating layer; and subsequently ion-implanting second impurities into the semiconductor substrate, using the offset spacer as an ion-implantation mask to form a shallow source/drain region on the semiconductor substrate adjacent to the deep source/drain region.

13. The method of claim 12, wherein the second insulating layer is formed of material having a high etch selectivity with respect to the first insulating layer.

14. The method of claim 13, wherein the second insulating layer is formed of an oxide layer, and the first insulating layer is formed of a nitride layer.

15. The method of claim 12, wherein the first insulating layer is formed of material having a high etch selectivity to the buffer insulating layer.

16. The method of claim 15, wherein the first insulating layer is formed of a nitride layer, and the buffer insulating layer is formed of an oxide layer.

17. The method of claim 12, wherein the forming of the shallow source/drain region further comprises annealing the second ion-implanted impurities.

18. The method of claim 17, wherein the annealing of the second ion-implanted impurities is performed at temperature of 500–800° C. or 900–1300° C. using rapid thermal annealing or spike thermal processing.

19. The method of claim 12, wherein the removing of the first spacer leaves the buffer insulating layer on the surface of the semiconductor substrate, and the buffer insulating layer remains on the surface of the semiconductor substrate as the second impurities are ion-implanted into the semiconductor substrate to form the shallow source/drain region.

20. The method of claim 12, wherein the removing of the first spacer leaves the buffer insulating layer on the surface of the semiconductor substrate, and the buffer insulating layer remains on the surface of the semiconductor substrate as the shallow source/drain region is formed.

* * * * *